(12) United States Patent
Bloemer et al.

(10) Patent No.: US 12,353,767 B2
(45) Date of Patent: Jul. 8, 2025

(54) TECHNIQUES FOR TRANSFERRING COMMANDS TO A DYNAMIC RANDOM-ACCESS MEMORY

(71) Applicant: NVIDIA CORPORATION, Santa Clara, CA (US)

(72) Inventors: Robert Bloemer, Sterling, MA (US); Gautam Bhatia, Mountain View, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 18/494,707

(22) Filed: Oct. 25, 2023

(65) Prior Publication Data

US 2024/0069812 A1 Feb. 29, 2024

Related U.S. Application Data

(63) Continuation of application No. 17/523,780, filed on Nov. 10, 2021, now Pat. No. 11,861,229.
(Continued)

(51) Int. Cl.
*G06F 3/06* (2006.01)
*G11C 11/406* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
None
See application file for complete search history.

(56) References Cited

U.S. PATENT DOCUMENTS 5,488,639 A * 1/1996 MacWilliams ....... H04L 7/0338
375/362
5,991,231 A 11/1999 Koshikawa
(Continued)

FOREIGN PATENT DOCUMENTS

CN 103064791 A 4/2013
CN 106126447 A 11/2016
(Continued)

OTHER PUBLICATIONS

Second Office Action received for Chinese Application No. 202210094417.3 dated Oct. 11, 2024, 7 pages.
(Continued)

*Primary Examiner* — Ly D Pham
(74) *Attorney, Agent, or Firm* — Squire Patton Boggs LLP; Sarah Mirza

(57) ABSTRACT

Various embodiments include a memory device that is capable of transferring both commands and data via a single clock signal input. In order to initialize the memory device to receive commands, a memory controller transmits a synchronization command to the memory device. The synchronization command establishes command start points that identify the beginning clock cycle of a command that is transferred to the memory device over multiple clock cycles. Thereafter, the memory controller transmits subsequent commands to the memory device according to a predetermined command length. The predetermined command length is based on the number of clock cycles needed to transfer each command to the memory device. Adjacent command start points are separated from one another by the predetermined command length. In this manner, the memory device avoids the need for a second lower speed clock signal for transferring commands to the memory device.

20 Claims, 6 Drawing Sheets

Related U.S. Application Data

(60) Provisional application No. 63/179,954, filed on Apr. 26, 2021, provisional application No. 63/152,817, filed on Feb. 23, 2021, provisional application No. 63/152,814, filed on Feb. 23, 2021, provisional application No. 63/144,971, filed on Feb. 2, 2021.

(51) Int. Cl.
    *G11C 11/4072*     (2006.01)
    *G11C 11/4076*     (2006.01)
    *G11C 11/4096*     (2006.01)

(52) U.S. Cl.
    CPC ..... *G11C 11/40615* (2013.01); *G11C 11/4072* (2013.01); *G11C 11/4076* (2013.01); *G11C 11/4096* (2013.01)

(56) References Cited

U.S. PATENT DOCUMENTS

| | | |
|---|---|---|
| 7,420,869 B2 | 9/2008 | Lindorfer et al. |
| 2003/0005250 A1 | 1/2003 | Johnson et al. |
| 2003/0147299 A1 | 8/2003 | Setogawa |
| 2006/0018185 A1 | 1/2006 | Kurotsuchi et al. |
| 2009/0103362 A1 | 4/2009 | Penky et al. |
| 2016/0173074 A1 | 6/2016 | Chen et al. |
| 2017/0069364 A1 | 3/2017 | Shin et al. |
| 2017/0110173 A1 | 4/2017 | Matsuno et al. |
| 2017/0230038 A1* | 8/2017 | Shin ............... H04L 7/0331 |
| 2018/0130516 A1 | 5/2018 | Kim et al. |
| 2020/0110716 A1 | 4/2020 | Mozak et al. |
| 2021/0072785 A1* | 3/2021 | Hsu ............... G06F 1/12 |

FOREIGN PATENT DOCUMENTS

| | | |
|---|---|---|
| CN | 111124998 A | 5/2020 |
| EP | 1 414 045 A1 | 4/2004 |

OTHER PUBLICATIONS

Samsung Electronics Co., Ltd., "8Gb GDDR6 SGRAM C-die", Rev. 1.3, Jan. 2020, 187 pages.
First Office Action received for Chinese Application No. 202210094417.3 dated May 29, 2024, 6 pages.
First Office Action received for Chinese Application No. 202210088808.4 dated Aug. 15, 2024, 7 pages.
Third Office Action received for Chinese Application No. 20Z210094417.3 dated Jan. 23, 2025, 8 pages.
Notification of Registration and Granting Patent received for Chinese Application No. 2022100944173 dated Apr. 24, 2025, 2 pages.

* cited by examiner

TECHNIQUES FOR TRANSFERRING COMMANDS TO A DYNAMIC RANDOM-ACCESS MEMORY

CROSS-REFERENCE TO RELATED APPLICATIONS

This application is a continuation of the co-pending U.S. patent application titled, "TECHNIQUES FOR TRANSFERRING COMMANDS TO A DYNAMIC RANDOM-ACCESS MEMORY," filed on Nov. 10, 2021, and having Ser. No. 17/523,780, which claims priority benefit of the United States Provisional patent application titled, "TECHNIQUES FOR TRANSFERRING COMMANDS TO A DRAM," filed on Feb. 2, 2021 and having Ser. No. 63/144,971. This application further claims priority benefit of the United States Provisional patent application titled, "DATA SCRAMBLING ON A MEMORY INTERFACE," filed on Feb. 23, 2021, and having Ser. No. 63/152,814. This application further claims priority benefit of the United States Provisional patent application titled, "DRAM COMMAND INTERFACE TRAINING," filed on Feb. 23, 2021, and having Ser. No. 63/152,817. This application further claims priority benefit of the United States Provisional patent application titled, "DRAM WRITE TRAINING," filed on Apr. 26, 2021, and having Ser. No. 63/179,954. The subject matter of these related applications is hereby incorporated herein by reference.

BACKGROUND

Field of the Various Embodiments

Various embodiments relate generally to computer memory devices and, more specifically, to techniques for transferring commands to a dynamic random-access memory.

Description of the Related Art

A computer system generally includes, among other things, one or more processing units, such as central processing units (CPUs) and/or graphics processing units (GPUs), and one or more memory systems. One type of memory system is referred to as system memory, which is accessible to both the CPU(s) and the GPU(s). Another type of memory system is graphics memory, which is typically accessible only by the GPU(s). These memory systems comprise multiple memory devices. One example memory device employed in system memory and/or graphics memory is synchronous dynamic-random access memory (SDRAM or, more succinctly, DRAM).

Conventionally, a high-speed DRAM memory device employs multiple interfaces. These interfaces employ multiple separate clock signals for transferring commands and data to and from the DRAM. A low-speed clock signal is employed for transferring commands to the DRAM via a command interface. Such commands include a command to initiate a write operation, a command to initiate a read operation, and/or the like. After the command is transferred to the DRAM, a second high-speed clock signal is employed for transferring data to and from the DRAM via a data interface. In some cases, commands and data may be overlapped. For example, a command for a first DRAM operation may be transferred to DRAM via the low-speed clock signal. Subsequently, the data for the first DRAM operation may be transferred to DRAM via the high-speed clock signal concurrently with transferring the command for a second DRAM operation via the low-speed clock signal. Then, the data for the second DRAM operation may be transferred to DRAM via the high-speed clock signal concurrently with transferring the command for a third DRAM operation via the low-speed clock signal, and so on.

When employing different clock signals for the command interface and the data interface, the high-speed clock signal and the low-speed clock signal need to be synchronized with one another at the clock signal source generator. Such clock signals are referred to as source synchronous clock signals. The high-speed clock signal and the low-speed clock signal travel are transmitted from the clock signal source generator to the DRAM via separate signal paths. These signal paths may have different lengths, resulting in different delay times between the clock signal source generator and the DRAM. Further, the signal paths may travel through different intervening devices which may have different internal delays and are subject to variations in the internal delay. These variations are due to process variations at the time of manufacture as well as local variations due to changes in operating temperature, supply voltage, and/or the like.

As a result, even if the two clock signals are synchronous at the source, the two clock signals are not presumed to be synchronous when the clock signals reach the DRAM. To account for this phenomenon, the DRAM includes synchronizing and training circuitry to determine the skew between the two clock signals. This synchronizing and training circuitry allows the DRAM to properly manage the internal timing in order to correctly transfer commands and data to and from the DRAM.

One disadvantage of this technique is that the synchronizing and training circuitry increases the complexity of the internal circuitry of the DRAM, consumes surface area of the DRAM die, and increases power consumption. Another disadvantage of this technique is that two receivers are required, and two input/output (I/O) pins of each DRAM memory device are consumed for receiving the two clock signals. As a result, the additional receiver and I/O pin to receive the second clock signal are unavailable to accommodate other signals, such as an additional command bit, data bit, or control signal. Further, certain DRAM modules include multiple DRAM devices. In addition, each clock signal may be a differential signal that requires two I/O pins for each clock signal. In one example, a DRAM module with four DRAM devices and differential clock signals would require eight I/O pins for the data clock signals and eight additional I/O pins for the command clock signals.

Another disadvantage of this technique is that the overhead for performing this synchronization and training takes a finite amount of time. Further, this synchronization and training is performed each time the DRAM memory device exits a low-power state, such as a power down state or a self-refresh state. As a result, the latency for a DRAM memory device with multiple clock inputs to exit a low-power state is relatively high. This relatively high latency to exit from a low-power state reduces the performance of a system the employs these types of DRAM memory devices. Alternatively, systems that employ these types of DRAM memory devices may elect to not take advantage of these low-power states with long exit latencies. As a result, such systems may have higher performance, but may be unable to reap the benefits of low-power states, such as power down states, self-refresh states, and/or the like.

As the foregoing illustrates, what is needed in the art are more effective techniques for transferring commands and data to and from memory devices.

SUMMARY

Various embodiments of the present disclosure set forth a computer-implemented method for transferring commands to a memory device. The method includes receiving a synchronization signal on an input pin of the memory device, wherein the synchronization signal specifies a starting point of a first command. The synchronization signal may be in the form of a signal, such as a pulse signal, received on any one or more input/output pins of the memory device, such as the command input/output pins. Additionally or alternatively, the synchronization signal may be any signal and/or other indication that the memory device employs to identify the phase of the input clock signal that sets the command start point.

The method further includes synchronizing the memory device to a first clock edge of a clock signal input relative to the synchronization signal. The method further includes receiving a first portion of a first command at the first clock edge. The method further includes receiving a second portion of the first command at a second clock edge of the clock signal input that follows the first clock edge Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, commands and data are received by a memory device at different transfer rates via a single clock signal. As a result, the memory device does not need internal synchronizing and training circuitry to account for possible skew between multiple clock signals. An additional advantage of the disclosed techniques is that only one receiver and I/O pin are needed to receive the clock signal rather than two receivers and I/O pins. As a result, the complexity of the internal circuitry, the surface area, and power consumption of the DRAM die may be reduced relative to approaches involving multiple clock signals. Further, the I/O pin previously employed to receive the second clock signal is available for another function, such as an additional command bit, data bit, or control signal. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
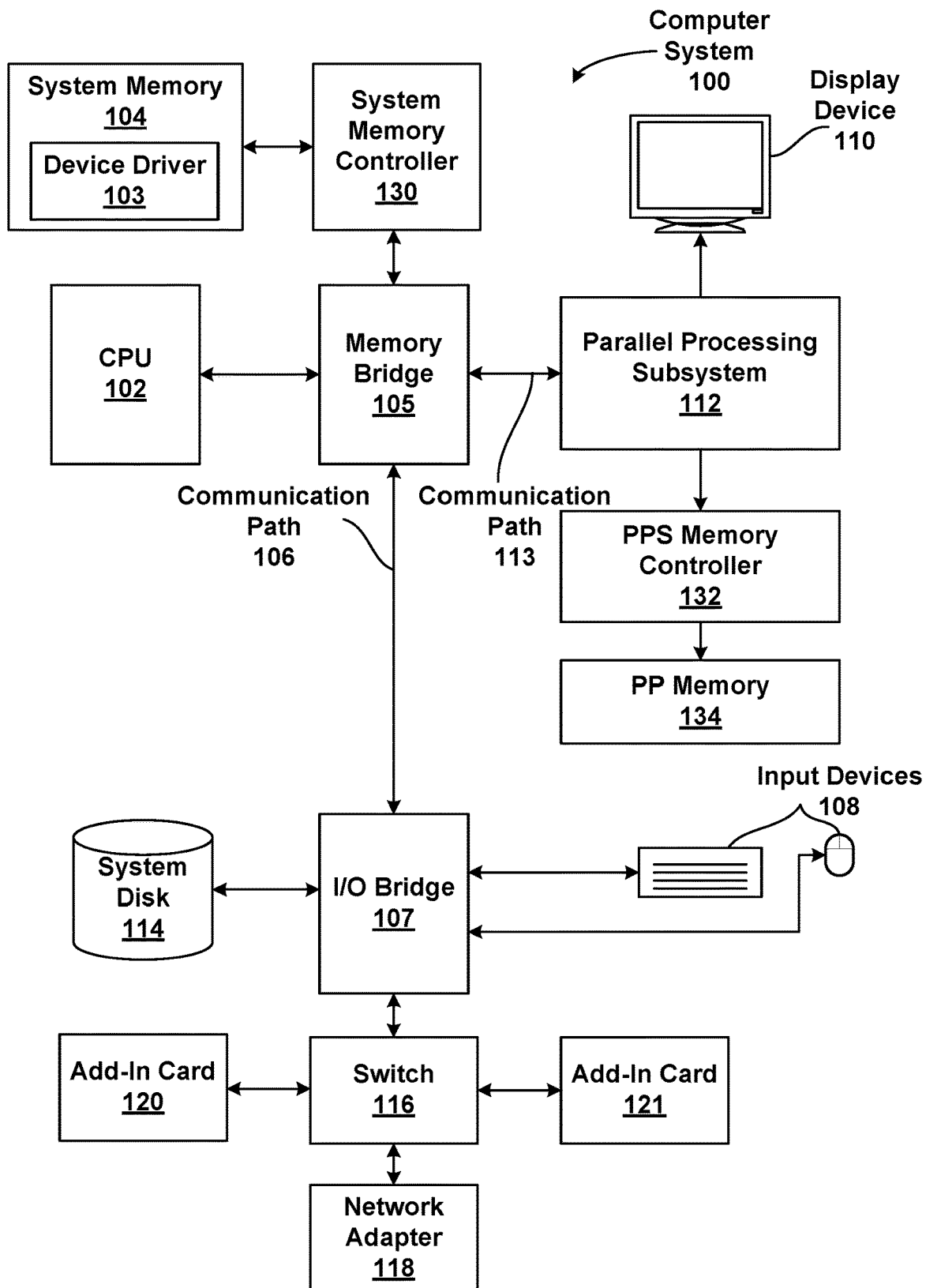
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Parallel processing subsystem 112 is coupled to parallel processing memory 134 via a parallel processing subsystem (PPS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, and/or the like. In such embodiments, parallel processing subsystem 112 incorporates circuitry optimized for graphics and video processing, including, for example, video output circuitry. Such circuitry may be incorporated across one or more parallel processing units (PPUs) included within parallel processing subsystem 112. In some embodiments, each PUPS comprises a graphics processing unit (GPU) that may be configured to implement a graphics rendering pipeline to perform various operations related to generating pixel data based on graphics data supplied by CPU 102 and/or system memory 104. Each PPU may be implemented using one or more integrated circuit devices, such as programmable processors, application specific integrated circuits (ASICs), or memory devices, or in any other technically feasible fashion.

In some embodiments, parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other elements of FIG. 1 to form a single system. For example, parallel processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of PPUs within parallel processing subsystem 112. In some embodiments, CPU 102 writes a stream of commands for PPUs within parallel processing subsystem 112 to a data structure (not explicitly shown in FIG. 1) that may be located in system memory 104, PP memory 134, or another storage location accessible to both CPU 102 and PPUs. A pointer to the data structure is written to a pushbuffer to initiate processing of the stream of commands in the data structure. The PPU reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each PPU includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the PPU. The connection of PPUs to the rest of computer system 100 may be varied. In some embodiments, parallel processing subsystem 112, which includes at least one PPU, is implemented as an add-in card that can be inserted into an expansion slot of computer system 100. In other embodiments, the PPUs can be integrated on a single chip with a bus bridge, such as memory bridge 105 or I/O bridge 107. Again, in still other embodiments, some or all of the elements of the PPUs may be included along with CPU 102 in a single integrated circuit or system of chip (SoC).

CPU 102 and PPUs within parallel processing subsystem 112 access system memory via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices.

In addition, PPUs and/or other components within parallel processing subsystem 112 access PP memory 134 via a parallel processing subsystem (PPS) memory controller 132. PPS memory controller 132 transmits signals to the memory devices included in PP memory 134 to initiate the memory devices, transmit commands to the memory devices, write data to the memory devices, read data from the memory devices, and/or the like. One example memory device employed in PP memory 134 synchronous graphics random access memory (SGRAM), which is a specialized form of SDRAM for computer graphics applications. One particular type of SGRAM is graphics double-data rate SGRAM (GDDR SDRAM or, more succinctly, GDDR). Compared with DDR memory devices, GDDR memory devices are configured with a wider data bus, in order to transfer more data bits with each memory write and read operation. By employing double data rate technology and a wider data bus, GDDR memory devices are able to achieve the high data transfer rates typically needed by PPUs.

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, parallel processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more PPUs within parallel processing subsystem 112, memory shared between multiple parallel processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Transferring Commands and Data to and from a DRAM Via a Single Clock Signal

Various embodiments include an improved DRAM that uses a single clock to transfer both commands and data to and from the DRAM. The single command/data clock in the DRAM can be selected to operate at speeds similar to or higher than the high-speed clock of a conventional multiple clock signal high-speed DRAM. With the disclosed techniques, the bits of the commands are serialized by a memory controller and transmitted to the DRAM over a small number of connections to the DRAM command (CA) I/O pins. In some examples, the bits of the commands are transmitted over a single connection to a single DRAM CA I/O pin using the single data/command clock of the DRAM. To initialize the DRAM to receive one or more commands, the memory controller transmits a synchronization command to the DRAM. The synchronization command establishes the clock edges that correspond to the start of each command, referred to as command start points. The synchronization command may be in the form of a synchronization signal applied to one or more I/O pins of the DRAM.

Thereafter, the memory controller transmits subsequent commands to the DRAM according to a predetermined command length. The predetermined command length is based on the number of clock cycles needed to transfer each command to the DRAM. Stated another way, a time period between a first command start point and a second consecutive command start point is based on a command length that specifies a total number of portions of a command transferred over consecutive clock cycles. Adjacent command start points are separated from one another by the predetermined command length. In some examples, the memory controller transmits commands to the DRAM over five I/O pins, labeled CA[4:0]. The memory controller transmits each command over four clock cycles of the high-speed clock signal, where one fourth of the command is transmitted per clock cycle. As a result, the complete command includes up to 24-bits. In this manner, the DRAM avoids the need for a second lower speed clock signal for transferring commands to the DRAM.

Figure 2:
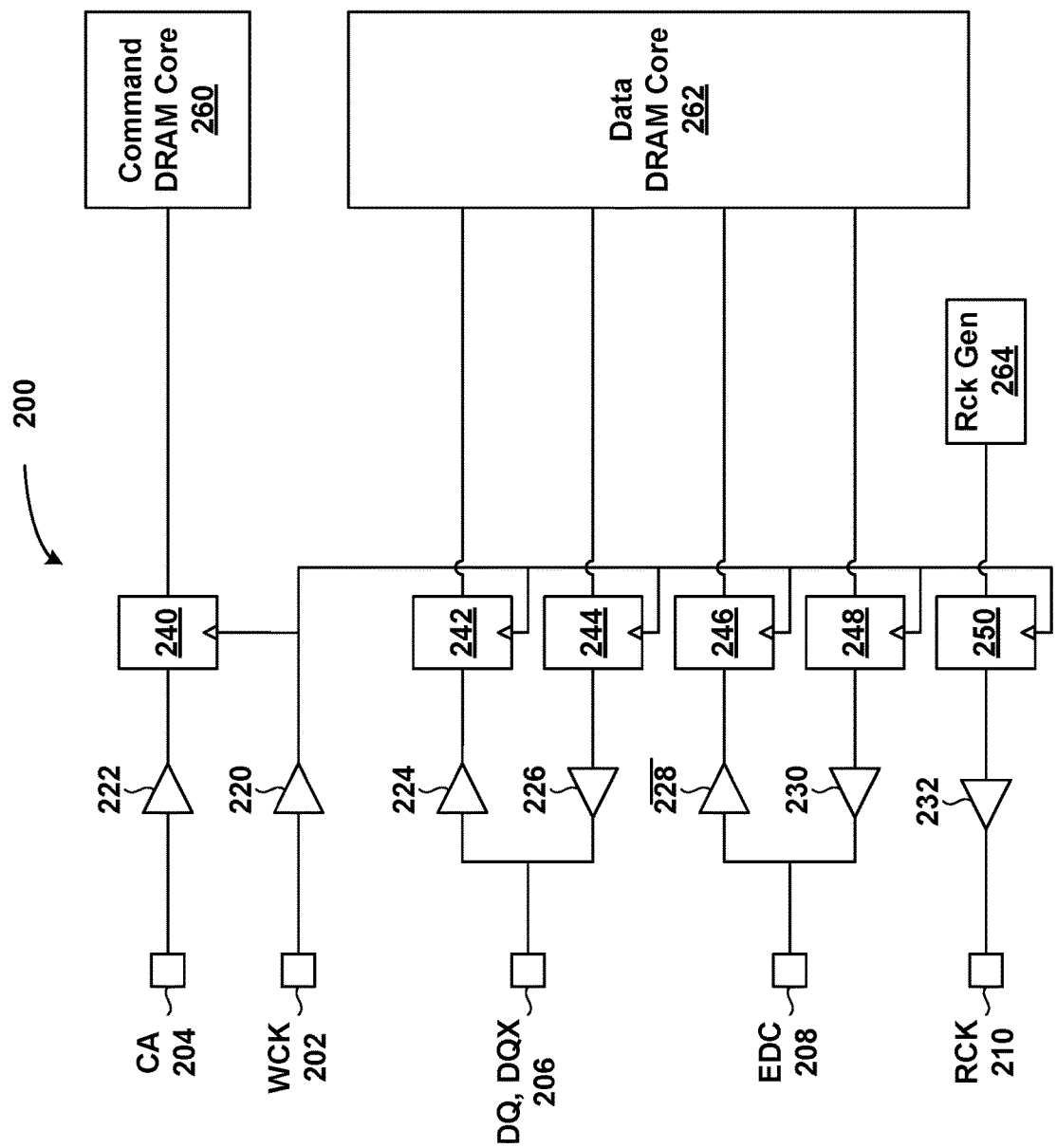
FIG. 2 is a block diagram of a clocking architecture for a memory device included in system memory and/or parallel processing memory of the computer system of FIG. 1, according to various embodiments.

FIG. 2 is a block diagram of a clocking architecture 200 for a memory device included in system memory 104 and/or parallel processing memory 134 of the computer system 100 of FIG. 1, according to various embodiments.

As shown, the clocking architecture 200 for the memory device includes a single clock signal WCK 202 that synchronizes various commands transferred to the memory device. In particular, the WCK 202 clock signal is received from the memory controller by the memory device via a WCK receiver 220 and then transmitted to various synchronizing registers to capture commands and data being transferred to and from the memory device. In that regard, synchronizing register 240 captures the data presented on command (CA) pins 204 via receiver 222 at clock edges of the WCK 202 clock signal. After synchronization by the synchronizing register 240, the synchronized CA bits are stored in a command DRAM core 260.

Similarly, the single clock signal WCK 202 synchronizes various data transferred to the memory device. In that regard, synchronizing register 242 captures main data and extended data (DQ/DQX) bits 206 via receiver 224 at clock edges of the WCK 202 clock signal. After synchronization by the synchronizing register 242, the synchronized DQ/DQX bits 206 are stored in a data DRAM core 262. Likewise, synchronizing register 246 captures error detection and correction data (EDC) bits 208 via receiver 228 at clock edges of the WCK 202 clock signal. After synchronization by the synchronizing register 246, the synchronized EDC bits 208 are stored in the data DRAM core 262.

The single clock signal WCK 202 of the clocking architecture 200 for the memory device also synchronizes various data transferred from the memory device to other devices. In that regard, synchronizing register 244 captures main data and extended data (DQ/DQX) read from the data DRAM core 262 at clock edges of the WCK 202 clock signal. After synchronization by the synchronizing register 244, the synchronized DQ/DQX bits 206 are transmitted via transmitter 226 to the other device. Likewise, synchronizing register 248 captures error detection and correction data (EDC) bits 208 read from the data DRAM core 262 bits at clock edges of the WCK 202 clock signal. After synchronization by the synchronizing register 248, the synchronized EDC bits 208 are transmitted via transmitter 230 to the other device.

During read operations of DQ/DQX bits 206 and/or EDC bits 208, the memory device may transmit a read clock (RCK) signal 210 that is synchronous with the DQ/DQX bits 206 and/or EDC bits 208 transmitted by the memory device. In such cases, synchronizing register 250 synchronizes a read clock (RCK) generated by a read clock (RCK) generator 264 to be synchronous with WCK 202. Transmitter 232 transmits the synchronized RCK signal 210 to the memory controller. As a result, the RCK signal 210 is synchronous with the DQ/DQX bits 206 synchronized by synchronizing register 244 and/or with the EDC bits 208 synchronized by synchronizing register 248.

Figure 3:
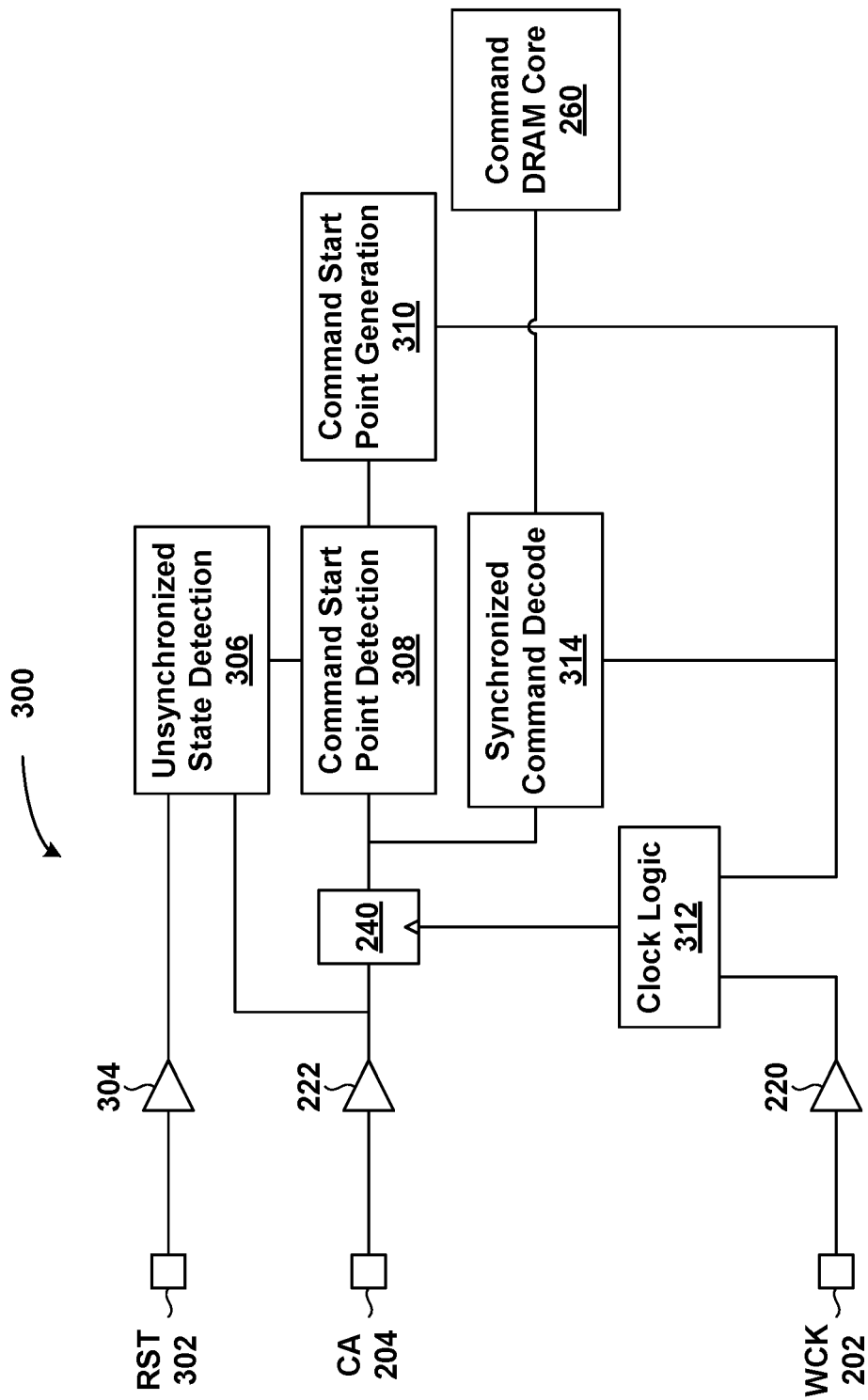
FIG. 3 is a more detailed block diagram of the command address clocking architecture for the memory device included in system memory and/or parallel processing memory of the computer system of FIG. 1, according to various embodiments.

FIG. 3 is a more detailed block diagram of the command address clocking architecture 300 for the memory device included in system memory 104 and/or parallel processing memory 134 of the computer system 100 of FIG. 1, according to various embodiments. As shown, command address clocking architecture 300 includes unsynchronized state detection logic 306. Unsynchronized state detection logic 306 detects, based on various conditions, whether the command pin (CA) interface is synchronized or unsynchronized. In some examples, unsynchronized state detection logic 306 includes asynchronous logic circuits that do not receive a clock signal. Additionally or alternatively, unsynchronized state detection logic 306 includes synchronous logic circuits that receive a clock signal, such as a version of the WCK 202 clock signal. Unsynchronized state detection logic 306 detects when the memory device attempts to exit from a low power, reset, or CA training state. In response, unsynchronized state detection logic 306 enables command start point detection logic 308. Upon receipt of a synchronization command or a command start point command, the memory device synchronizes the synchronized command decode 314 and/or the clock logic 312 based on the phase of WCK 202 that received the synchronization command. This condition completes the synchronization procedure of the CA interface, at which point the memory device is ready to accept regular synchronous commands from the memory controller.

In some examples, unsynchronized state detection logic 306 detects that the CA interface is unsynchronized. Unsynchronized state detection logic 306 detects this state when the memory device is initially powered on, such as by a full power down and power up of VPP, VDD, VDDQ, and/or the like. In some examples, unsynchronized state detection logic 306 detects an assertion followed by a deassertion of the reset (RST) input signal 302. When unsynchronized state detection logic 306 detects these conditions, unsynchronized state detection logic 306 determines that the CA interface is unsynchronized. In addition, the memory controller initiates a CA training procedure in order to train the unsynchronized CA interface, as described herein. In general, unsynchronized state detection logic 306 does not determine when CA training procedures are needed. Instead, the memory controller determines when CA training procedures are needed. After the CA training procedure completes, unsynchronized state detection logic 306 transmits a signal to command start point detection logic 308 to indicate that the CA interface is now synchronized.

In some examples, unsynchronized state detection logic 306 detects that the memory device is recovering from a low-power state, such as a power down state, a self-refresh state, and/or the like, without undergoing a reset 302 or a full power down and power up of VPP, VDD, and/or VDDQ. In general, when the memory device is in a low-power state, the memory device powers down one or more receivers that receive external inputs and enters an asynchronous state. In such cases, the CA interface may lose synchronization with the memory controller. CA training procedures are optional when the memory device exits from a low-power state, a power down state, a self-refresh state, and/or the like. The memory controller may reestablish synchronization via an asynchronous procedure without assertion of a reset 302 or a full power down and power up of VPP, VDD, and/or VDDQ. With this asynchronous procedure, the memory device may remove power from receivers and transmitters of all I/O pins, including WCK 202, except for a receiver for one or more I/O pins of the memory device involved in the asynchronous procedure. When recovering from the power down state or self-refresh state, the memory controller applies, and unsynchronized state detection logic 306 searches for, a particular value on the one or more I/O pins of the memory device with an active receiver. For example, the memory device may keep the receiver for one of the CA 204 command I/O pins active during power down or self-refresh states.

When recovering from the power down or self-refresh state, the memory controller may apply, and unsynchronized state detection logic 306 may detect, a low value on the CA 204 command I/O pin over four successive clock cycles of WCK 202. In response, the memory device begins a synchronization phase and waits to receive a synchronization command from the memory controller to establish a new first command start point. The synchronization command may be in the form of a synchronization signal applied to one or more I/O pins of the memory device. Advantageously, this asynchronous procedure allows the memory controller to reestablish synchronization with the CA interface without incurring the latency and penalty of performing another CA training procedure and/or other signal training procedures. Instead, the memory device resumes synchronous operation with the memory controller quickly when recovering from a low-power state, such as a power down state, a self-refresh state, and/or the like. After the asynchronous procedure completes, unsynchronized state detection logic 306 transmits a signal to command start point detection logic 308 to indicate that the CA interface is now synchronized.

Command start point detection logic 308 receives a notification from unsynchronized state detection logic 306 when the CA interface is unsynchronized. Command start point detection logic 308 receives the notification when the memory device exits from a self-refresh state, a power down state, a CA training operation, a reset, and/or the like. In response, command start point detection logic 308 begins detecting specific command start point commands received via CA 204 command I/O pins. After command start point detection logic 308 receives a command start point, and the command start point is aligned with the memory controller, command start point detection logic 308 determines that the CA interface is synchronized. Command start point detection logic 308 transmits signals to command start point generation logic 310 to begin the process of generating command start points, as described herein.

Command start point generation logic 310 generates signals, referred to as command start points, that indicate the start of each command received via CA 204 command I/O pins. Command start point generation logic 310 enables capture of synchronous multi-cycle commands. Command start point generation logic 310 generates command start points via various techniques. In some examples, command start point generation logic 310 includes counter-based logic that counts a number 'n' of phases or cycles of WCK 202, where n is the number of partial command words in each full command word. Command start point generation logic 310 generates a command start point every n cycles. Additionally or alternatively, command start point generation logic 310 may include other counter-based logic, clock divider circuitry, clock detection logic, and/or the like. In some examples, each command may include four partial command words (n=4), then command start point generation logic 310 generates a signal when the first partial command word is present on CA 204 command I/O pins. Command start point generation logic 310 does not generate a signal when the second, third, and fourth partial command words are present on CA 204 command I/O pins. Command start point generation logic 310 again generates a signal when the first partial command word of the subsequent command is present on CA 204 command I/O pins. Command start point generation logic 310 transmits the generated command start points to clock logic 312 and synchronized command decode logic 314.

Clock logic 312 receives the WCK clock signal 202 via receiver 220 and also receives command start points from command start point generation logic 310. In some examples, clock logic 312 generates synchronized and divided phases of WCK 202 to transmit to synchronizing register 240, so that synchronizing register 240 accurately captures the partial command words received via CA 204 command I/O pins.

In various examples, clock logic 312 may or may not employ the command start point indication received from command start point generation logic 310. In some examples, the memory device captures the state of the CA 204 command I/O pins on certain rising and/or falling edges of WCK 202. In such examples, clock logic 312 does not need to use the command start points to determine when to sample the CA 204 command I/O pins. Instead, only the command deserialization logic and/or synchronized command decode logic 314 determine the command start points. The command start points may be determined via a counter that is initially synchronized using the command start point. Once synchronized, the counter is free running and remain in synchronization with the memory controller. Additionally or alternatively, clock logic 312 receives a single command start point to set the phase of the divided clock signals. Clock logic 312 synchronizes an internal clock divider to the single command start point. From that point on, clock logic 312 generates divided clock signals that continue to remain in synchronization with the original command start point(s).

Synchronized command decode logic 314 receives signals from command start point generation logic 310 to identify the start point of each command received via CA 204 command I/O pins. Synchronized command decode logic 314 is enabled after command start point detection is complete, indicating that the CA interface is synchronized. After the CA interface is synchronized, synchronized command decode logic 314 can decode synchronous commands received via CA 204 command I/O pins, including read commands, write commands, activate commands, and/or the like. Additionally or alternatively, after the CA interface is synchronized, synchronized command decode logic 314 can decode asynchronous commands received via CA 204 command I/O pins, including commands that do not have a command start point. Synchronized command decode logic 314 transmits decoded commands to command DRAM core 260.

Figure 4:
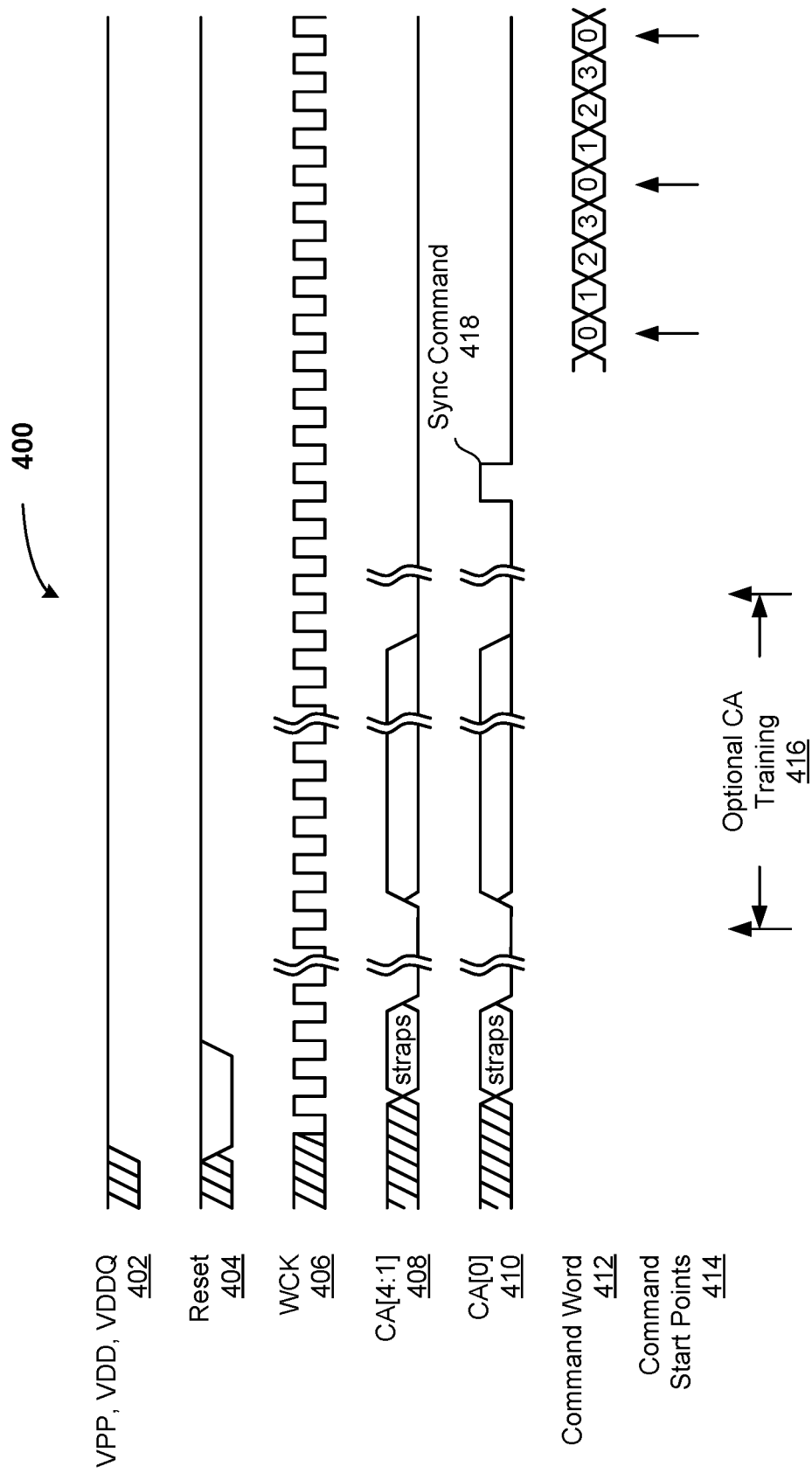
FIG. 4 is a timing diagram illustrating the initialization of the memory device included in system memory and/or parallel processing memory of the computer system of FIG. 1 to receive commands, according to various embodiments.

FIG. 4 is a timing diagram 400 illustrating the initialization of the memory device included in system memory 104 and/or parallel processing memory 134 of the computer system of FIG. 1 to receive commands, according to various embodiments.

The memory device employs a single clock signal scheme that captures both command and data. The rate of the clock signal is determined by the transfer rate of the highest speed interface of the memory device. Typically, the data interface transfers data at a higher rate than the command interface. However, in some embodiments, the command interface may transfer data at a higher rate than the data interface. The rate of the clock signal rate is set at the transfer rate of the highest speed interface, such as the data interface. This clock signal is employed to transfer data to and from the memory device, typically at a rate of one data transfer per clock cycle.

This clock signal is further employed to transfer commands, at a lower transfer rate, to the memory device. More specifically, commands are transferred to the memory device over multiple clock cycles of the high-speed clock signal, such as over four clock cycles. The high-speed clock signal is labeled WCK 406 and illustrates the timing of the WCK 202 I/O pin of FIG. 2. The command interface includes any number of I/O pins for transferring the command to the memory device, including the CA I/O pins 204 of FIG. 2. In some embodiments, the command interface includes five I/O pins, labeled CA[4:0], shown separately as CA[4:1] 408 and CA[0] 410 command I/O pins.

In some embodiments, each command transferred over four clock cycles of the WCK 406. The references to 0, 1, 2, and 3 represent the four phases of a command word 412. A full command word 412 is transferred to the memory device over four cycles of WCK 406, over a consecutive series of clock cycles 0, 1, 2, and 3. Therefore, a complete command includes up to 4 clock cycles×6 bits per clock cycle=24 bits. Each full command word 412 represents a command to be performed by the memory device, such as a write operation, a read operation, an activate operation, and/or the like.

In order to synchronize transfer of commands to the memory device, the memory controller, such as system memory controller 130 or parallel processing subsystem (PPS) memory controller 132, transmits a synchronization (sync) command 418 to the memory device prior to transferring commands to the memory device. As shown, the synchronization command 418 is in the form of a synchronization pulse signal received on the CA[0] 410 command I/O pin of the memory device. Additionally or alternatively, the synchronization command 418 may be in the form of a synchronization pulse signal received on any other technically feasible input/output pin of the memory device, such as one of the CA[4:1] 408 command I/O pins. Additionally or alternatively, the synchronization command 418 may be in the form of a synchronization signal received on any technically feasible combination of input/output pins of the memory device, such as two or more of the CA[4:1] 408 and/or CA[0] 410 command I/O pins. Additionally or alternatively, the synchronization command 418 may be any signal and/or other indication that the memory device employs to identify the phase of WCK 406 that sets the command start point 414.

As shown, the memory device receives the first command start point 414, indicating the phase 0 of the first command, from the memory controller at four phases of WCK 406 after receiving the synchronization command 418. Additionally or alternatively, the memory device may receive the first command start point 414 at any technically feasible number of phases WCK 406 after receiving the synchronization command 418, such as a multiple of four phases, a non-multiple of four phases, and/or fewer than four phases.

The synchronization command 418 indicates the valid command start points 414 for transferring commands, that is, which clock edge corresponds to the first portion of the multi-cycle command. At certain times, the memory device loses synchronization and does not know which clock cycles are valid command start points 414. For example, the memory device loses synchronization when powered up, when recovering from a reset, when recovering from a low-power state, such as a power down state or a self-refresh state, and/or the like. In such cases, the memory controller transmits a synchronization command 418 to the memory device that enforces a new command start point 414 and synchronizes the memory device with the memory controller. Once synchronized, the memory device may begin accepting commands from the memory controller.

More specifically, the memory device may power up when VPP, VDD, and VDDQ 402 are applied to the memory device, where VPP is the pump voltage, VDD is the main power supply voltage, and VDDQ is the I/O voltage. The memory controller applies a low voltage to the reset 404 input of the memory device, placing the memory device in a reset state. Subsequently, the memory controller applies a high voltage to the reset 404 input of the memory device in order to bring the memory device out of the reset state. Prior to applying the high voltage to the reset 404 input, the memory controller may apply a fixed bit pattern to the CA[4:1] 408 and CA[0] 410 command I/O pins of the memory device. This fixed bit pattern is referred to herein as "straps." The memory device samples the state of the straps on the rising edge of reset 404 to determine the value of the fixed bit pattern. Based on the fixed bit pattern, the memory device may undergo certain startup procedures, such as an optional command pin (CA) training 416 procedure to command the memory device to determine the skew between WCK 406 and the CA[4:1] 408 and CA[0] 410 command I/O pins. The memory controller completes the startup procedures, such as the optional CA training 416 procedure, via an asynchronous communication sequence with the memory device. The optional CA training 416 procedure determines an optimal skew of the CA[4:1] 408 and CA[0] 410 command I/O pins with respect to WCK 406 to ensure that setup and hold time requirements are met for the CA[4:1] 408 and CA[0] 410 command I/O pins. The optional CA training 416 procedure further detects and corrects any multiple cycle skewing between any two or more command I/O pins to ensure that all command I/O pins are capturing command bits for the same command word 412 on the same rising or falling edge of WCK 406.

After completion of the optional CA training 416 procedure, the memory device is in a state where commands may be received synchronously with respect to rising edges and/or falling edges of WCK 406. Alternatively, if the memory controller and memory device did not perform the optional CA training 416 procedure, then the memory device is ready to receive commands synchronously any time after the rising edge of reset 404. In either case, the memory controller transmits a synchronization command 418 to the memory device prior to transferring commands to the memory device on one of the command I/O pins, shown in FIG. 4 as the CA[0] 410 command I/O pin. When the memory device receives the synchronization command 418, the memory device counts a number of rising edges or falling edges of WCK 406 from either the leading edge or the trailing edge of the synchronization command 418. In some examples, the memory device counts four rising edges of WCK 406 after the trailing edge of the synchronization command 418 to determine the first command start point 414. The memory controller, in turn, applies phase 0 of the first command word 412 to the CA[4:1] 408 and CA[0] 410 command I/O pins. The memory controller applies phase 0 of the first command word 412 so as to be valid at the fourth rising edge of WCK 406 after the trailing edge of the synchronization command 418. The memory controller applies phases 1, 2, and 3 of the first command word 412 so as to be valid at the consecutive rising edges of WCK 406. The memory device samples the four phases of the first command word 412 on the CA[4:1] 408 and CA[0] 410 on these same four rising edges of WCK 406. The first rising edge of WCK 406 after phase 3 of the first command word 412 represents a second command start point 414. The memory controller applies, and the memory device transfers, the four phases 0, 1, 2, 3 of the second command word 412 on four successive rising edges of WCK 406 starting with the second command start point 414. The first rising edge of WCK 406 after phase 3 of the second command word 412 represents a third command start point 414, and so on.

In some embodiments, the memory device may recover from a power down state, a self-refresh state, and/or the like without undergoing a reset 404 or a full power down and power up of VPP, VDD, VDDQ 402. In such cases, the memory device may lose synchronization with the memory controller. In such cases, the memory controller may reestablish synchronization via an asynchronous procedure without assertion of a reset 404 or a full power down and power up of VPP, VDD, VDDQ 402. With this asynchronous procedure, the memory device may remove power from receivers and transmitters of all I/O pins, including WCK 406, except for a receiver for one or more I/O pins of the memory device involved in the asynchronous procedure. When recovering from the power down state or self-refresh state, the memory controller applies, and the memory device searches for, a particular value on the one or more I/O pins of the memory device with an active receiver. For example, the memory device may keep the receiver for the CA[0] 410 command I/O pin active during power down or self-refresh states. When recovering from the power down or self-refresh state, the memory controller may apply, and the memory device may detect, a low value on the CA[0] 410 command I/O pin over four successive clock cycles of WCK 406. In response, the memory device begins a synchronization phase and waits to receive a synchronization command 418 from the memory controller to establish a new first command start point 414. The synchronization command 418 may be in the form of a synchronization signal applied to one or more I/O pins of the memory device. Advantageously, this asynchronous procedure allows the memory controller to reestablish synchronization with the memory device without incurring the latency and penalty of performing another optional CA training 416 procedure and/or other signal training procedures. Instead, the memory device resumes synchronous operation with the memory controller quickly when recovering from a low-power state, such as a power down state, a self-refresh state, and/or the like.

Figure 5:
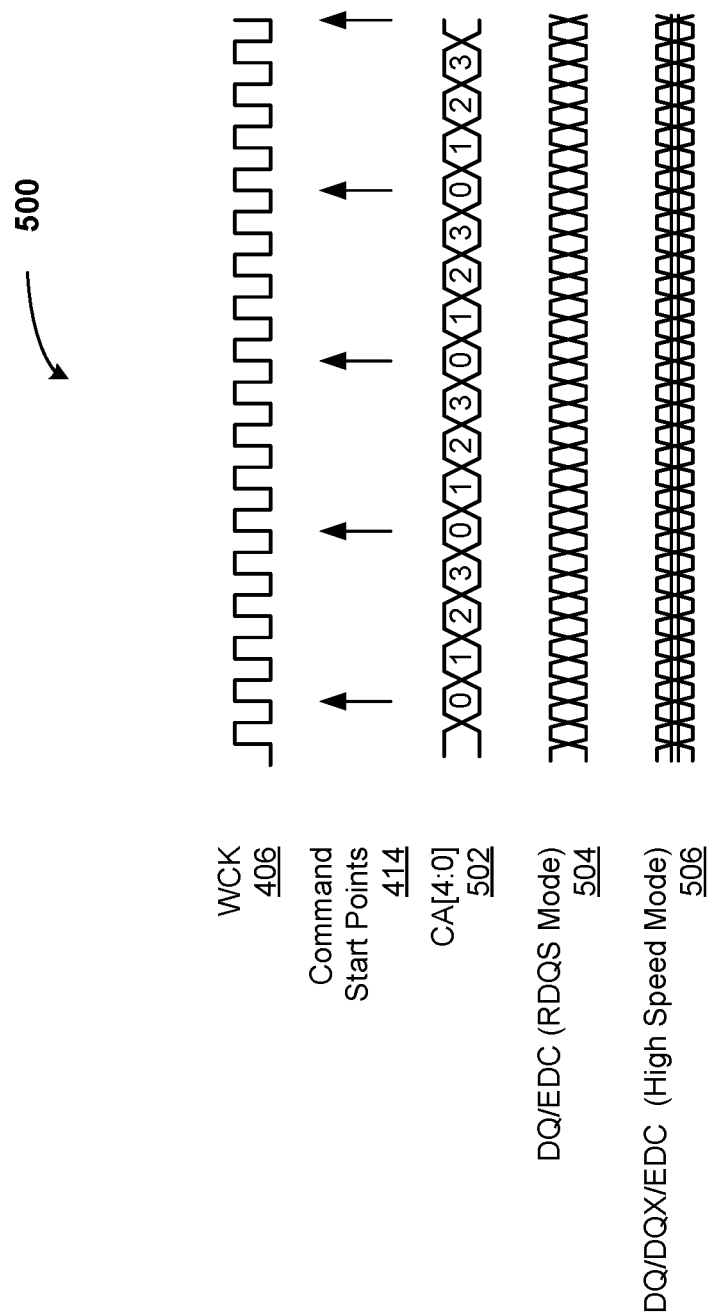
FIG. 5 is a timing diagram illustrating the transfer of successive commands to a memory device included in system memory and/or parallel processing memory of the computer system of FIG. 1, according to various embodiments.

FIG. 5 is a timing diagram 500 illustrating the transfer of successive commands to a memory device included in system memory 104 and/or parallel processing memory 134 of the computer system of FIG. 1, according to various embodiments.

As shown, the high-speed clock signal is a single clock signal for commands and data, labeled WCK 406, and illustrates the timing of the WCK 202 I/O pin of FIG. 2. The command interface includes any number of I/O pins for transferring the command to the memory device, including the CA I/O pins 204 of FIG. 2. In some embodiments, the command interface includes five I/O pins, labeled CA[4:0] 502, and are the same command I/O pins shown separately as the CA[4:1] 408 and CA[0] 410 command I/O pins of FIG. 4. In some embodiments, the command bits CA[4:0] 502 may be encoded via a non-return to zero (NRZ) data signaling mode.

Five command start points 414 are shown in FIG. 5, where each command start point 414 is coincident with a rising edge of WCK 406 coincident with phase 0 of a four-phase command. Three successive phases 1, 2, 3 of a command are coincident with three successive rising edges of WCK 406. The rising clock edge of WCK 406 following phase 3 of a command is followed by a command start point 414 for phase 0 of the following command.

Data transferred to and from the memory device may include main data bits (DQ), extended data bits (DQX), and error detection bits (EDC). The error detection bits are used to detect and/or correct bit errors in the main data bits and/or extended data bits via any technically feasible error detection and correction code, such as a cyclic redundancy check (CRC) code.

The memory device may employ multiple data signaling modes based on different data transfer modes. For example, DQ and EDC data bits may employ a redundant data strobe (RDQS) data transfer mode, as shown in the DQ/EDC 504 timing diagram. In such cases, the DQ and EDC data bits may be encoded via an NRZ data signaling mode. In RDQS data transfer mode, data is transmitted to and from the memory device as one-bit symbols captured at twice the rate of command phases, on every rising edge and every falling edge of WCK 406. Therefore, each DQ and EDC symbol includes one bit of data. Additionally or alternatively, the data transmitted to and from the memory device may employ a data transfer mode that transfers symbols that include two or more bits of data. In one example, the DQ, DQX, and EDC data bits may be encoded via a high-speed multilevel mode with symbols that carry more than one bit of data. One such data transfer mode is the 4-level pulse amplitude modulation (PAM4) data transfer mode that employs two-bit symbols, as shown in the DQ/DQX/EDC 506 timing diagram. In PAM 4 mode, data is transmitted to and from the memory device as two-bit symbols captured at twice the rate of command phases, on every rising edge and every falling edge of WCK 406. The PAM4 data transfer mode allows each data I/O pin to carry two bits of data that are captured on every rising edge and every falling edge of WCK 406. Therefore, in PAM4 data transfer mode, the data transfer rate is four times the command transfer rate. Whether the memory device operates in RDQS mode, PAM4 mode, or any other data transfer mode, the same clock signal WCK 406 captures both the command bits and the data bits.

It will be appreciated that the system shown herein is illustrative and that variations and modifications are possible. Among other things, a single command word may include multiple groups of four phases. In some examples, a single command word may include a multiple of four phases, such as eight phases, twelve phases, and/or the like. In such examples each command is transmitted over multiple four-phase commands via the CA[4:0] I/O pins. For a single command that includes eight phases, the command is transmitted as two successive four-phase commands. As the memory controller transmits the first four-phase command to the memory device, the memory device recognizes that the command is an eight-phase command. The memory device receives the first four phases of the command starting with a certain command start point 414 and receives the second four phases of the command starting with the next consecutive command start point 414. Similarly, for a single command that includes twelve phases, the command is transmitted as three successive four-phase commands. As the memory controller transmits the first four-phase command to the memory device, the memory device recognizes that the command is a twelve-phase command. The memory device receives the first four phases of the command starting with a certain command start point 414 and receives the second four phases and the third four phases of the command starting with the next two consecutive command start points 414, and so on.

In another example, the commands transferred by the memory controller to the memory device are described as up to 24 command bits transmitted as four phases of five bits. However, the number of phases may be more than four phases or fewer than four phases, within the scope of the disclosed embodiments Further, the number of command bits may be more than five bits or fewer than five bits, within the scope of the disclosed embodiments. In yet another example, the signals disclosed herein are described in terms of rising and/or falling edges, high or low levels, and/or the like. However, rising edges and falling edges may be interchanged, high levels and low levels may be interchanged, and any other technically feasible changes may be made with respect to signal edges and levels within the scope of the disclosed embodiments.

Figure 6:
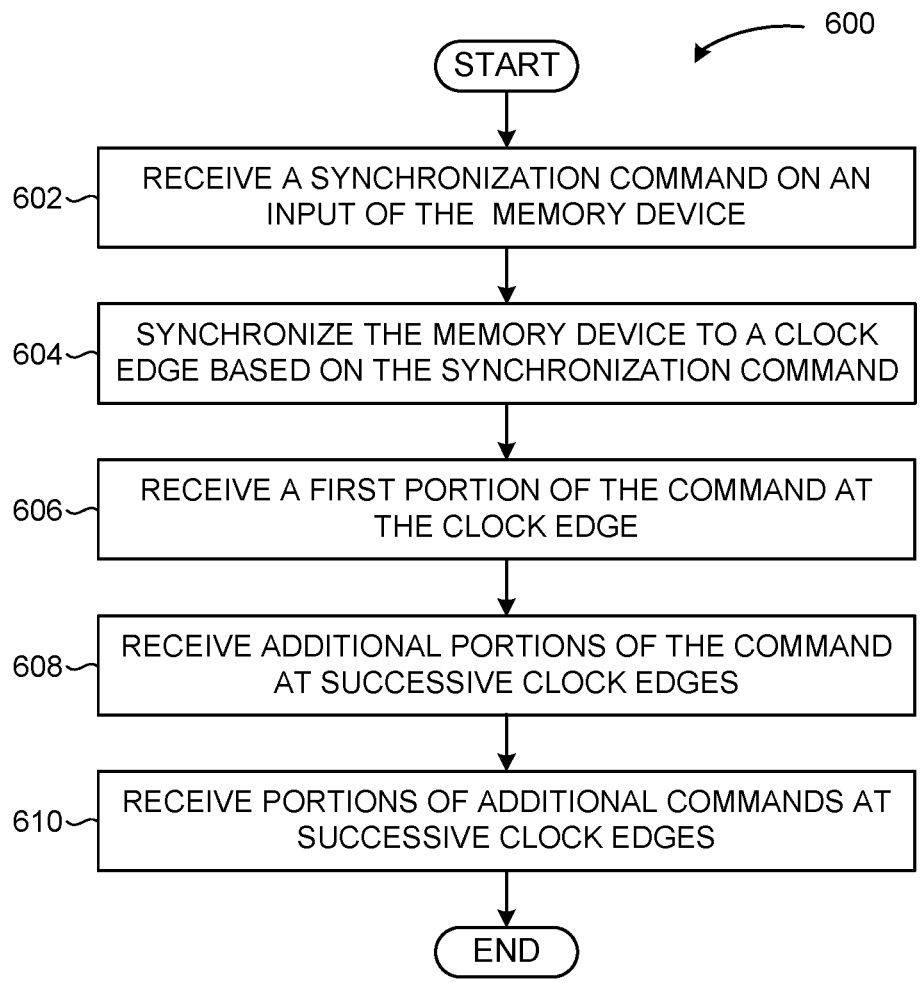
FIG. 6 is a flow diagram of method steps for transferring commands to a memory device included in system memory 104 and/or parallel processing memory 134 of the computer system of FIG. 1, according to various embodiments.

FIG. 6 is a flow diagram of method steps for transferring commands to a memory device included in system memory 104 and/or parallel processing memory 134 of the computer system of FIG. 1, according to various embodiments. Although the method steps are described in conjunction with the systems of FIGS. 1-4, persons of ordinary skill in the art will understand that any system configured to perform the method steps, in any order, is within the scope of the present disclosure.

As shown, a method 600 begins at step 602, where a memory device receives a synchronization command 418 on an input of the memory device. In order to synchronize transfer of commands to the memory device, a memory controller, such as system memory controller 130 or parallel processing subsystem (PPS) memory controller 132, transmits a synchronization command 418 to the memory device prior to transferring commands to the memory device. The synchronization command may be in the form of a synchronization signal applied to one or more I/O pins of the DRAM. The synchronization command 418 indicates the valid command start points 414 for transferring commands, that is, which clock edge corresponds to the first portion of the multi-cycle command. At certain times, the memory device loses synchronization and does not know which clock cycles are valid command start points 414. For example, the memory device loses synchronization when powered up, when recovering from a reset, when recovering from a low-power state, such as a power down state or a self-refresh state, and/or the like. In such cases, the memory controller transmits a synchronization command 418 to the memory device that enforces a new command start point 414 and synchronizes the memory device with the memory controller. Once synchronized, the memory device may begin accepting commands from the memory controller.

More specifically, the memory device may power up when VPP, VDD, and VDDQ 402 are applied to the memory device, where VPP is the pump voltage, VDD is the main power supply voltage, and VDDQ is the I/O voltage. The memory controller applies a low voltage to the reset 404 input of the memory device, placing the memory device in a reset state. Subsequently, the memory controller applies a high voltage to the reset 404 input of the memory device in order to bring the memory device out of the reset state.

At step 604, the memory device synchronizes to a clock edge based on the synchronization command 418. When the memory device receives the synchronization command 418, the memory device counts a number of rising edges or falling edges of a high-speed clock WCK 406 from either the leading edge or the trailing edge of the synchronization command 418. The high-speed clock WCK 406 is the same clock used by the memory device to receive and transmit data. In some examples, the memory device counts four rising edges of WCK 406 after the trailing edge of the synchronization command 418 to determine the first command start point 414.

At step 606, the memory device receives a first portion, phase 0, of the command on the WCK 406 clock edge determined at step 604. The memory controller, in turn, applies phase 0 of the first command word 412 to the CA[4:1] 408 and CA[0] 410 command I/O pins. The memory controller applies phase 0 of the first command word 412 so as to be valid at the fourth rising edge of WCK 406 after the trailing edge of the synchronization command 418.

At step 608, the memory device receives additional portions, phase 1, 2, and 3, of the command on successive WCK 406 clock edges after the clock edge determined at step 604. The memory controller applies phases 1, 2, and 3 of the first command word 412 so as to be valid at the consecutive rising edges of WCK 406. The memory device samples the four phases of the first command word 412 on the CA[4:1] 408 and CA[0] 410 on these same four rising edges of WCK 406.

At step 610, the memory device receives portions of additional commands on successive WCK 406 clock edges after the clock edge of phase 3 of the first command. The first rising edge of WCK 406 after phase 3 of the first command word 412 represents a second command start point 414. The memory controller applies, and the memory device transfers, the four phases 0, 1, 2, 3 of the second command word 412 on four successive rising edges of WCK 406 starting with the second command start point 414. The first rising edge of WCK 406 after phase 3 of the second command word 412 represents a third command start point 414, and so on.

The method 600 then terminates. Alternatively, the method 600 proceeds to step 610 to transfer additional commands to the memory device. Thus, by repeatedly transferring commands to the memory device in the described manner, commands and data may be transferred to and from the memory device via a single high-speed clock signal. If the memory device subsequently loses synchronization, such as when powered up, when recovering from a reset, when recovering from a low-power state, such as a power down state or a self-refresh state, and/or the like, then the method 600 proceeds to step 602 to begin synchronization again.

In sum, various embodiments include an improved DRAM that uses a single clock to transfer both commands and data to and from the DRAM. The single command/data clock in the DRAM can be selected to operate at speeds similar to or higher than the high-speed clock of a conventional multiple clock signal high-speed DRAM. With the disclosed techniques, the bits of the commands are serialized by a memory controller and transmitted to the DRAM over a small number of connections to the DRAM command (CA) I/O pins. In some examples, the bits of the commands are transmitted over a single connection to a single DRAM CA I/O pin using the single data/command clock of the DRAM. To initialize the DRAM to receive one or more commands, the memory controller transmits a synchronization command to the DRAM. The synchronization command establishes the clock edges that correspond to the start of each command, referred to as command start points. The synchronization command may be in the form of a synchronization signal applied to one or more I/O pins of the DRAM.

Thereafter, the memory controller transmits subsequent commands to the DRAM according to a predetermined command length. The predetermined command length is based on the number of clock cycles needed to transfer each command to the DRAM. Adjacent command start points are separated from one another by the predetermined command length. In some examples, the memory controller transmits commands to the DRAM over five I/O pins, labeled CA[4:0]. The memory controller transmits each command over four clock cycles of the high-speed clock signal, where one fourth of the command is transmitted per clock cycle. As a result, the complete command includes up to 24-bits. In this manner, the DRAM avoids the need for a second lower speed clock signal for transferring commands to the DRAM.

At least one technical advantage of the disclosed techniques relative to the prior art is that, with the disclosed techniques, commands and data are received by a memory device at different transfer rates via a single clock signal. As a result, the memory device does not need internal synchronizing and training circuitry to account for possible skew between multiple clock signals. An additional advantage of the disclosed techniques is that only one receiver and I/O pin are needed to receive the clock signal rather than two receivers and I/O pins. As a result, the complexity of the internal circuitry, the surface area, and power consumption of the DRAM die may be reduced relative to approaches involving multiple clock signals. Further, the I/O pin previously employed to receive the second clock signal is available for another function, such as an additional command bit, data bit, or control signal. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for transferring commands to a memory device, the method comprising:
    receiving an asynchronous signal on a data input pin of the memory device while a receiver for a clock signal input pin associated with the data input pin is powered down;
    determining that data received by the memory device via the asynchronous signal has a first value;
    in response to determining that the data has the first value, initiating a synchronization phase to receive a synchronization command from a memory controller; and
    in response to receiving the synchronization command, establishing synchronization with the memory controller.

2. The computer-implemented method of claim 1, further comprising:
    establishing a first command start point based on the synchronization command; and
    establishing a second command start point based on the synchronization command,
    wherein the second command start point follows the first command start point in time.

3. The computer-implemented method of claim 2, wherein a time period between the first command start point and the second command start point is based on a command length that specifies a number of portions of a first command associated with the first command start point.

4. The computer-implemented method of claim 3, wherein the command length comprises four portions of the first command.

5. The computer-implemented method of claim 3, wherein a first portion included in the number of portions of the first command and a second portion included in the number of portions of the first command are received via a plurality of command input pins.

6. The computer-implemented method of claim 5, wherein the synchronization command is received via a first command input pin included in the plurality of command input pins.

7. The computer-implemented method of claim 2, further comprising receiving one or more data bits associated with a first command relative to the first command start point.

8. The computer-implemented method of claim 7, further comprising receiving one or more data bits associated with a second command relative to the second command start point.

9. The computer-implemented method of claim 2, wherein the first command start point is established to be at a time relative to a termination of the synchronization command.

10. The computer-implemented method of claim 1, wherein the synchronization command is received after recovering from at least one of a power down state, a reset state, or a self-refresh state.

11. A system, comprising:
    a memory controller; and
    a memory device coupled to the memory controller, wherein the memory controller:
        receives an asynchronous signal on a data input pin of the memory device while a receiver for a clock signal input pin associated with the data input pin is powered down;
        determines that data received by the memory device via the asynchronous signal has a first value;
        in response to determining that the data has the first value, initiates a synchronization phase to receive a synchronization command from the memory controller; and
        in response to receiving the synchronization command, establishes synchronization with the memory controller.

12. The system of claim 11, wherein the memory device further: establishes a first command start point based on the synchronization command; and establishes a second command start point based on the synchronization command, wherein the second command start point follows the first command start point in time.

13. The system of claim 12, wherein a time period between the first command start point and the second command start point is based on a command length that specifies a number of portions of a first command associated with the first command start point.

14. The system of claim 13, wherein the command length comprises four portions of the first command.

15. The system of claim 13, wherein a first portion included in the number of portions of the first command and a second portion included in the number of portions of the first command are received via a plurality of command input pins.

16. The system of claim 15, wherein the synchronization command is received via a first command input pin included in the plurality of command input pins.

17. The system of claim 12, wherein the memory device further receives one or more data bits associated with a first command relative to the first command start point.

18. The system of claim 17, wherein the memory device further receives one or more data bits associated with a second command relative to the second command start point.

19. The system of claim 12, wherein the first command start point is established to be at a time relative to a termination of the synchronization command.

20. The system of claim 11, wherein the synchronization command is received after recovering from at least one of a power down state, a reset state, or a self-refresh state.

* * * * *